(12) United States Patent
Kojima et al.

(10) Patent No.: US 9,006,766 B2
(45) Date of Patent: Apr. 14, 2015

(54) SEMICONDUCTOR LIGHT EMITTING DEVICE

(71) Applicant: Kabushiki Kaisha Toshiba, Tokyo (JP)

(72) Inventors: Akihiro Kojima, Kanagawa-ken (JP); Miyuki Shimojuku, Kanagawa-ken (JP); Yoshiaki Sugizaki, Kanagawa-ken (JP); Yosuke Akimoto, Kanagawa-ken (JP); Takayoshi Fujii, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/961,619

(22) Filed: Aug. 7, 2013

(65) Prior Publication Data

US 2013/0320382 A1    Dec. 5, 2013

Related U.S. Application Data

(63) Continuation of application No. PCT/JP2012/000469, filed on Jan. 25, 2012.

(30) Foreign Application Priority Data

May 17, 2011   (JP) ................... 2011-110372

(51) Int. Cl.
*H01L 33/00* (2010.01)
*H01L 33/36* (2010.01)
(Continued)

(52) U.S. Cl.
CPC ............... *H01L 33/36* (2013.01); *H01L 33/44* (2013.01); *H01L 33/62* (2013.01); *H01L 33/502* (2013.01); *H01L 33/38* (2013.01); *H01L 2224/16225* (2013.01)

(58) Field of Classification Search
CPC ....... H01L 33/44; H01L 33/36; H01L 33/502; H01L 33/62; H01L 33/38
USPC ................................... 257/98, 99, 79
See application file for complete search history.

(56) References Cited

U.S. PATENT DOCUMENTS 7,554,126 B2   6/2009   Higashi et al.
8,110,421 B2   2/2012   Sugizaki et al.
(Continued)

FOREIGN PATENT DOCUMENTS

EP   2 325 905 A2   5/2011
EP   2 325 906 A1   5/2011
(Continued)

OTHER PUBLICATIONS

International Search Report mailed Aug. 7, 2012 for PCT/JP2012/000469 filed on Jan. 25, 2012 in English.
(Continued)

*Primary Examiner* — Colleen A Matthews
*Assistant Examiner* — Quovaunda V Jefferson
(74) *Attorney, Agent, or Firm* — Oblon, McClelland, Maier & Neustadt, L.L.P.

(57) ABSTRACT

According to one embodiment, a semiconductor light emitting device includes a semiconductor layer, a p-side electrode, an n-side electrode, an inorganic insulating film, a p-side interconnection portion, an n-side interconnection portion, and an organic insulating film. The organic insulating film is provided on the inorganic insulating film, at least on a portion between the p-side interconnection portion and the n-side interconnection portion. An end portion of the p-side interconnection portion on the n-side interconnection portion side and an end portion of the n-side interconnection portion on the p-side interconnection portion side override the organic insulating film.

21 Claims, 7 Drawing Sheets

(51) Int. Cl.
*H01L 33/44* (2010.01)
*H01L 33/62* (2010.01)
*H01L 33/50* (2010.01)
*H01L 33/38* (2010.01)

(56) References Cited

U.S. PATENT DOCUMENTS

| | | | |
|---|---|---|---|
| 8,148,183 | B2 | 4/2012 | Hamasaki et al. |
| 8,278,676 | B2 | 10/2012 | Kojima et al. |
| 8,288,843 | B2 | 10/2012 | Kojima et al. |
| 8,319,246 | B2 | 11/2012 | Sugizaki et al. |
| 8,350,285 | B2 | 1/2013 | Sugizaki et al. |
| 8,367,523 | B2 | 2/2013 | Sugizaki et al. |
| 8,368,089 | B2 | 2/2013 | Kojima et al. |
| 8,373,192 | B2 | 2/2013 | Sugizaki et al. |
| 8,377,726 | B2 | 2/2013 | Kojima et al. |
| 8,378,377 | B2 | 2/2013 | Sugizaki et al. |
| 8,436,378 | B2 | 5/2013 | Kojima et al. |
| 8,445,916 | B2 | 5/2013 | Kojima et al. |
| 8,502,260 | B2 | 8/2013 | Sugizaki et al. |
| 2009/0050909 | A1 | 2/2009 | Chen et al. |
| 2010/0140640 | A1 | 6/2010 | Shimokawa et al. |
| 2010/0148198 | A1 * | 6/2010 | Sugizaki et al. ............... 257/98 |
| 2011/0027921 | A1 | 2/2011 | Hamasaki et al. |
| 2011/0073889 | A1 | 3/2011 | Sugizaki et al. |
| 2011/0204396 | A1 | 8/2011 | Akimoto et al. |
| 2011/0220931 | A1 | 9/2011 | Kojima |
| 2011/0284910 | A1 | 11/2011 | Iduka et al. |
| 2011/0291148 | A1 | 12/2011 | Sugizaki et al. |
| 2011/0297965 | A1 | 12/2011 | Akimoto et al. |
| 2011/0297980 | A1 | 12/2011 | Sugizaki et al. |
| 2011/0297995 | A1 | 12/2011 | Akimoto et al. |
| 2011/0297997 | A1 | 12/2011 | Izuka et al. |
| 2011/0298001 | A1 | 12/2011 | Akimoto et al. |
| 2011/0300651 | A1 | 12/2011 | Kojima et al. |

FOREIGN PATENT DOCUMENTS

| | | |
|---|---|---|
| EP | 2 365 542 A1 | 9/2011 |
| JP | 2000-244012 | 9/2000 |
| JP | 2001-257226 | 9/2001 |
| JP | 2002-118293 | 4/2002 |
| JP | 2004-228408 | 8/2004 |
| JP | 2004-288855 | 10/2004 |
| JP | 2008-091926 | 4/2008 |
| JP | 2008-270669 | 11/2008 |
| JP | 2009-105452 | 5/2009 |
| JP | 2010-087292 | 4/2010 |
| JP | 2010-226070 | 10/2010 |
| TW | 200910630 A | 3/2009 |
| TW | 201123526 A | 7/2010 |
| TW | 201031033 A | 8/2010 |
| TW | 201112455 A | 4/2011 |

OTHER PUBLICATIONS

Office Action issued Feb. 20, 2014, in Taiwan Patent Application No. 101104923 (with English-language translation).

Office Action mailed Jul. 16, 2014, in Japanese Patent Application No. 2011-110372, filed May 17, 2011 (with English-language translation).

* cited by examiner

SEMICONDUCTOR LIGHT EMITTING DEVICE

CROSS-REFERENCE TO RELATED APPLICATION

This is a continuation application of International Application PCT/JP2012/000469, filed on Jan. 25, 2012; the entire contents of which are incorporated herein by reference. This application also claims priority to Japanese Application No. 2011-110372, filed on May 17, 2011. The entire contents of each are incorporated herein by reference.

FIELD

Embodiments described herein relate generally to a semiconductor light emitting device.

BACKGROUND

In general, a semiconductor light emitting device can provide high brightness by injection of high current. However, injection of high current produces the problem of the decrease of light emission efficiency due to such causes as the temperature increase of the light emitting layer and even the light emitting device itself.

DETAILED DESCRIPTION

Figure 1A:
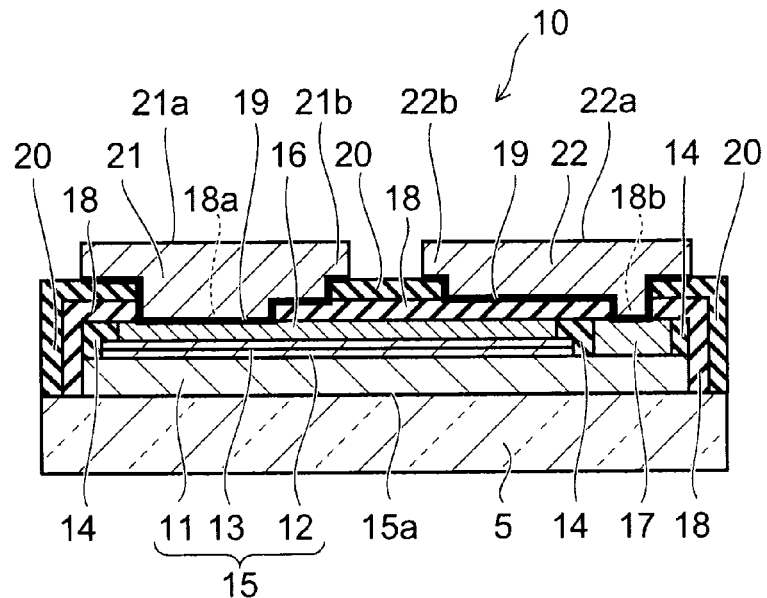
FIGS. 1A and 1B are schematic cross-sectional views of a semiconductor light emitting device of a first embodiment.

According to one embodiment, a semiconductor light emitting device includes a semiconductor layer, a p-side electrode, an n-side electrode, an inorganic insulating film, a p-side interconnection portion, an n-side interconnection portion, and an organic insulating film. The semiconductor layer includes a first surface, a second surface opposite to the first surface, and a light emitting layer. The p-side electrode is provided on a region including the light emitting layer on the second surface. The n-side electrode is provided on a region not including the light emitting layer on the second surface. The inorganic insulating film is provided on the second surface side. The inorganic insulating film includes a first via penetrated to the p-side electrode and a second via penetrated to the n-side electrode. The p-side interconnection portion is provided on the inorganic insulating film. The p-side interconnection portion is electrically connected to the p-side electrode through the first via. The n-side interconnection portion is provided on the inorganic insulating film. The n-side interconnection portion is spaced from the p-side interconnection portion. The n-side interconnection portion is electrically connected to the n-side electrode through the second via. The organic insulating film is provided on the inorganic insulating film, at least on a portion between the p-side interconnection portion and the n-side interconnection portion. An end portion of the p-side interconnection portion on the n-side interconnection portion side and an end portion of the n-side interconnection portion on the p-side interconnection portion side override the organic insulating film.

Embodiments will now be described with reference to the drawings. In the drawings, like elements are labeled with like reference numerals.

First Embodiment

Figure 1B:
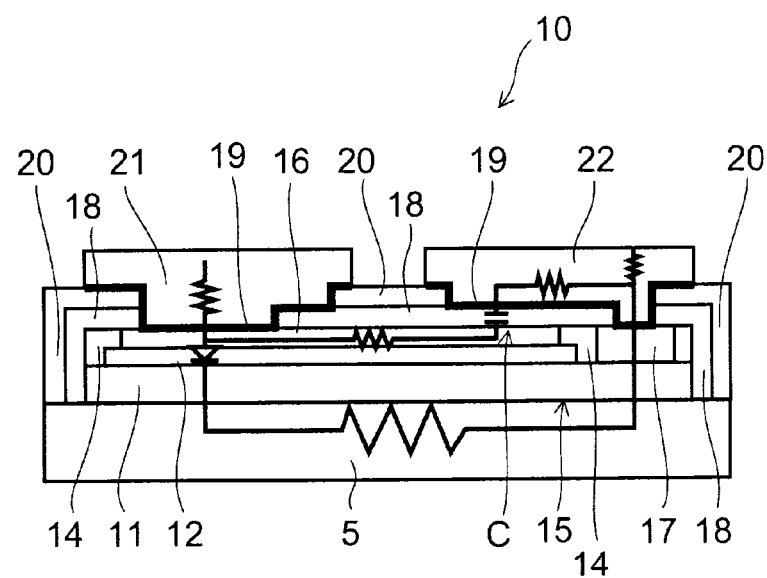

FIG. 1A is a schematic sectional view of a semiconductor light emitting device 10 of a first embodiment. FIG. 1B is a schematic diagram of an equivalent circuit superimposed on the cross-sectional structure of FIG. 1A.

The semiconductor light emitting device 10 includes a semiconductor layer 15. The semiconductor layer 15 includes a first surface 15a and a second surface formed on the opposite side (upper side in FIG. 1A) to the first surface 15a. The electrodes and the interconnection layers described later are provided on the second surface side. Light is emitted outside primarily from the first surface 15a opposite to the second surface.

The semiconductor layer 15 includes a first semiconductor layer 11 and a second semiconductor layer 12. The first semiconductor layer 11 and the second semiconductor layer 12 are made of a material including e.g. gallium nitride.

The first semiconductor layer 11 includes e.g. an underlying buffer layer and an n-type layer. The n-type layer functions as a lateral current path. The second semiconductor layer 12 has a stacked structure in which a light emitting layer (active layer) 13 is sandwiched between the n-type layer and a p-type layer.

As described later, the semiconductor layer 15 is formed on a substrate 5. In this embodiment, the substrate 5 is left intact. That is, the substrate 5 is provided on the first surface 15a, which is the main extraction surface of light in the semiconductor layer 15. The substrate 5 is thicker than the semiconductor layer 15 and provides mechanical strength to the semiconductor light emitting device 10.

The substrate 5 is a transparent body being transparent to the emission light from the light emitting layer 13. For instance, the substrate 5 can be a sapphire substrate. The substrate 5 has a refractive index between gallium nitride used for the semiconductor layer 15 and air. This prevents the refractive index of the medium from changing greatly in the direction of light extraction through the first surface 15a. Thus, the light extraction efficiency can be increased.

The second surface side of the semiconductor layer 15 is processed in a protrusion-depression configuration. The protrusion formed on the second surface side includes the light emitting layer 13. A p-side electrode 16 is provided on the surface of the second semiconductor layer 12 constituting the surface of the protrusion. That is, the p-side electrode 16 is provided on a region including the light emitting layer 13.

A region lacking the second semiconductor layer 12 including the light emitting layer 13 is provided beside the protrusion on the second surface side of the semiconductor layer 15. An n-side electrode 17 is provided on the surface of the first semiconductor layer 11 in that region. That is, the n-side electrode 17 is provided on the region not including the light emitting layer 13.

On the second surface side of the semiconductor layer 15, the area of the second semiconductor layer 12 including the light emitting layer 13 is larger than the area of the first semiconductor layer 11 not including the light emitting layer 13. Furthermore, the p-side electrode 16 provided on the region including the light emitting layer 13 has a larger area than the n-side electrode 17 provided on the region not including the light emitting layer 13. Thus, a large light emitting region is realized.

An insulating film 14 is provided on the side surface of the second semiconductor layer 12 including the light emitting layer 13, the side surface of the p-side electrode 16, and the side surface of the n-side electrode 17. The insulating film 14 covers the side surface of the second semiconductor layer 12, the side surface of the p-side electrode 16, and the side surface of the n-side electrode 17. The insulating film 14 is an inorganic insulating film such as a silicon oxide film and silicon nitride film. The surface of the p-side electrode 16 and the surface of the n-side electrode 17 are exposed from the insulating film 14.

An inorganic insulating film 18 is provided on the insulating film 14, the p-side electrode 16, and the n-side electrode 17. The inorganic insulating film 18 is e.g. a silicon oxide film or silicon nitride film. The inorganic insulating film 18 covers the side surface of the insulating film 14 and the side surface of the first semiconductor layer 11.

Furthermore, the inorganic insulating film 18 covers part of the surface of the p-side electrode 16 and part of the surface of the n-side electrode 17. In the inorganic insulating film 18, a first via 18a penetrated to the p-side electrode 16 and a second via 18b penetrated to the n-side electrode 17 are formed.

An organic insulating film 20 is selectively formed on the inorganic insulating film 18. The organic insulating film 20 is made of e.g. a resin such as polyimide. The organic insulating film 20 covers the side surface of the inorganic insulating film 18 and constitutes the outer surface of the semiconductor light emitting device 10 in conjunction with the substrate 5.

A first p-side interconnection layer 21 is provided in the first via 18a and on the inorganic insulating film 18 and the organic insulating film 20 around the first via 18a. A metal film 19 is provided below the first p-side interconnection layer 21. The first p-side interconnection layer 21 is electrically connected to the p-side electrode 16 through the metal film 19 provided in the first via 18a. A p-side interconnection portion of the embodiment includes the first p-side interconnection layer 21 and the metal film 19 below the first p-side interconnection layer 21. The metal film 19 is much thinner than the first p-side interconnection layer 21.

A first n-side interconnection layer 22 is provided in the second via 18b and on the inorganic insulating film 18 and the organic insulating film 20 around the second via 18b. A metal film 19 is provided below the first n-side interconnection layer 22. The first n-side interconnection layer 22 is electrically connected to the n-side electrode 17 through the metal film 19 provided in the second via 18b. An n-side interconnection portion of the embodiment includes the first n-side interconnection layer 22 and the metal film 19 below the first n-side interconnection layer 22. The metal film 19 is much thinner than the first n-side interconnection layer 22.

The organic insulating film 20 is provided on the inorganic insulating film 18 between the p-side interconnection portion and the n-side interconnection portion. A step is formed between the organic insulating film 20 and the inorganic insulating film 18. The first p-side interconnection layer 21 is provided via the metal film 19 so as to cover the step. That is, the end portion 21b of the first p-side interconnection layer 21 on the first n-side interconnection layer 22 side overrides the organic insulating film 20.

Also on the opposite side of the first p-side interconnection layer 21 from the end portion 21b, a step is formed between the organic insulating film 20 and the inorganic insulating film 18. The first n-side interconnection layer 22 is provided via the metal film 19 so as to cover the step. That is, the end portion 22b of the first n-side interconnection layer 22 on the first p-side interconnection layer 21 side overrides the organic insulating film 20.

The step between the organic insulating film 20 and the inorganic insulating film 18 is provided between the p-side electrode 16 and the n-side electrode 17. However, on the outside of the p-side electrode 16 (the left side of the first p-side interconnection layer 21 in FIG. 1A) and the outside of the n-side electrode 17 (the right side of the first n-side interconnection layer 22 in FIG. 1A), no step is provided between the organic insulating film 20 and the inorganic insulating film 18.

The end portion 21b and the end portion 22b overriding the organic insulating film 20 are spaced by a gap from each other.

In the first p-side interconnection layer 21, the portion between the end portion 21b and the portion in the first via 18a is provided on the inorganic insulating film 18 via the metal film 19. In the first n-side interconnection layer 22, the portion between the end portion 22b and the portion in the second via 18b is provided on the inorganic insulating film 18 via the metal film 19.

In the first p-side interconnection layer 21, the other end portion different from the end portion 21b on the first n-side interconnection layer 22 side is provided on the inorganic insulating film 18 via the organic insulating film 20 and the metal film 19. That is, the organic insulating film 20 is provided also below the other end portion of the first p-side interconnection layer 21 different from the end portion 21b.

In the first n-side interconnection layer 22, the other end portion different from the end portion 22b on the first p-side interconnection layer 21 side is provided on the inorganic insulating film 18 via the organic insulating film 20 and the metal film 19. That is, the organic insulating film 20 is provided also below the other end portion of the first n-side interconnection layer 22 different from the end portion 22b.

The first n-side interconnection layer 22 extends out toward the first p-side interconnection layer 21. That is, part of the first n-side interconnection layer 22 overlaps the inorganic insulating film 18 on the light emitting region including the light emitting layer 13.

Hence, as shown in the equivalent circuit of FIG. 1B, a capacitor C is formed in parallel to the pn junction in the semiconductor layer 15. The inorganic insulating film 18 functioning as a dielectric film in the capacitor C can be formed by e.g. the sputtering or chemical vapor deposition (CVD) process. Thus, the inorganic insulating film 18 can be made thinner than an organic film formed by e.g. the coating process. The thin inorganic insulating film 18 increases the capacitance of the capacitor C. This is advantageous to the improvement in the electrostatic discharge (ESD) resistance of the semiconductor light emitting device 10.

The area of the first n-side interconnection layer 22 is larger than the area of the n-side electrode 17. Furthermore, the area of the first n-side interconnection layer 22 spread on the inorganic insulating film 18 is larger than the area of the first n-side interconnection layer 22 connected to the n-side electrode 17 through the second via 18b by the metal film 19.

Because the light emitting layer 13 is formed over a larger region than the n-side electrode 17, high optical output can be achieved. The n-side electrode 17 is provided on a region smaller than the light emitting region and not including the light emitting layer 13. However, this embodiment can realize a structure in which the first n-side interconnection layer 22 having a larger area than the n-side electrode 17 is arranged on the mounting surface side.

The area of the first p-side interconnection layer 21 connected to the p-side electrode 16 through the first via 18a is larger than the area of the first n-side interconnection layer 22 connected to the n-side electrode 17 through the second via 18b. This improves the distribution of current to the light emitting layer 13, and can also improve the dissipation of heat generated in the light emitting layer 13. Here, the first p-side interconnection layer 21 may be connected to the p-side electrode 16 through a plurality of first vias 18a.

The first semiconductor layer 11 is electrically connected to the first n-side interconnection layer 22 through the n-side electrode 17 and the metal film 19. The second semiconductor layer 12 including the light emitting layer 13 is electrically connected to the first p-side interconnection layer 21 through the p-side electrode 16 and the metal film 19.

The surface of the first p-side interconnection layer 21 opposite to the semiconductor layer 15 functions as a p-side external terminal 21a. The surface of the first n-side interconnection layer 22 opposite to the semiconductor layer 15 functions as an n-side external terminal 22a.

Figure 2:
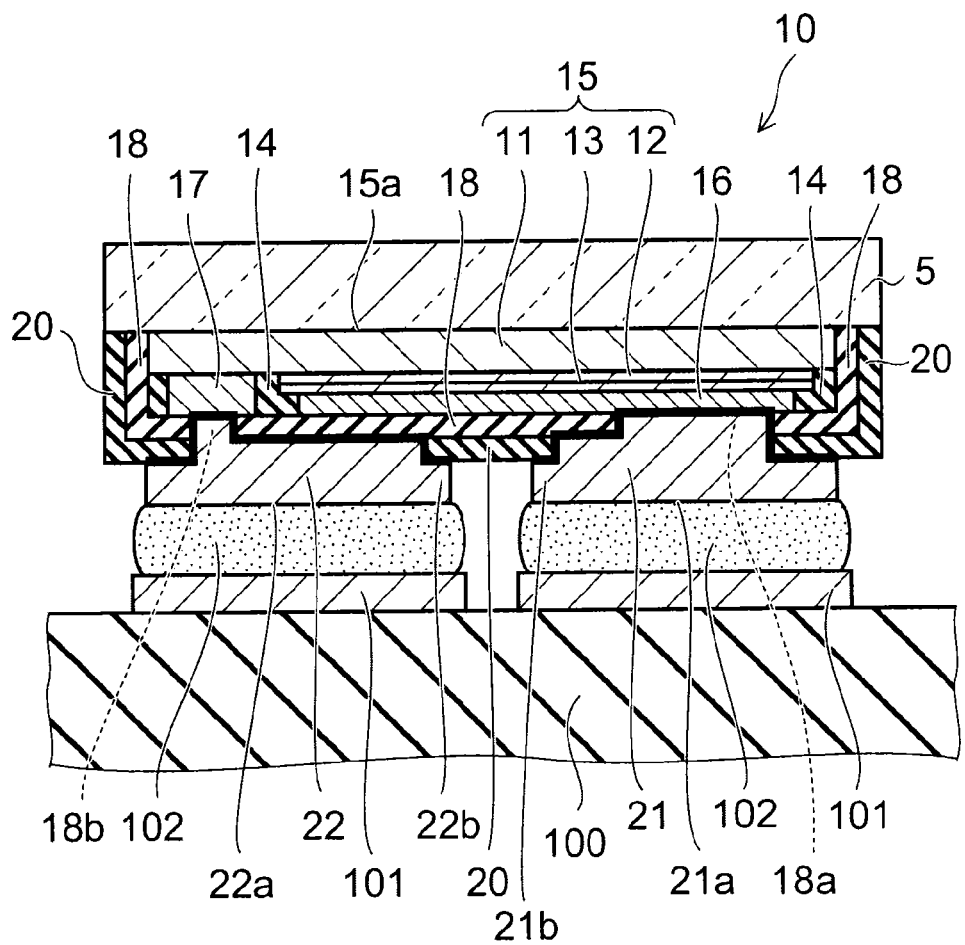
FIG. 2 is a schematic cross-sectional view illustrating a state of the semiconductor light emitting device of the first embodiment mounted on a mounting substrate.

FIG. 2 shows the state of the semiconductor light emitting device 10 of the embodiment mounted on a mounting substrate 100. In FIG. 2, the semiconductor light emitting device 10 is shown upside down with respect to FIG. 1A.

The p-side external terminal 21a and the n-side external terminal 22a are bonded with e.g. solder 102 to pads 101 formed on the surface of the mounting substrate 100. The mounting substrate 100 is e.g. a resin substrate or ceramic substrate. Here, instead of the solder 102, other metals may be used as a bonding material.

By injection of current into the light emitting layer 13, the light emitting layer 13 emits light, and generates heat. The dissipation of the heat toward the mounting substrate 100 primarily includes the following paths. One is the path in which the heat of the light emitting layer 13 is released through the p-side electrode 16 and the first via 18a to the first p-side interconnection layer 21. Furthermore, in the portion of the first p-side interconnection layer 21 overlapping the p-side electrode 16 across the inorganic insulating film 18, the heat of the light emitting layer 13 can be released through the p-side electrode 16 and the inorganic insulating film 18 to the first p-side interconnection layer 21. Furthermore, in the portion of the first n-side interconnection layer 22 overlapping the p-side electrode 16 across the inorganic insulating film 18, the heat of the light emitting layer 13 can be released through the p-side electrode 16 and the inorganic insulating film 18 to the first n-side interconnection layer 22.

The heat transferred to the first p-side interconnection layer 21 and the first n-side interconnection layer 22 is dissipated through the solder 102 and the pads 101 to the mounting substrate 100.

In this embodiment, an inorganic insulating film 18 is used as the insulating film provided between the electrode 16, 17 and the interconnection layer 21, 22. Inorganic materials have higher thermal conductivity than organic materials (resin materials). Thus, heat dissipation through the inorganic insulating film 18 to the interconnection layers 21, 22 can be increased. The semiconductor light emitting device having good heat dissipation can suppress the degradation of electrical characteristics and the decrease of light emission efficiency at the time of high current injection into the light emitting layer 13. As a result, high brightness can be achieved.

Figure 9:
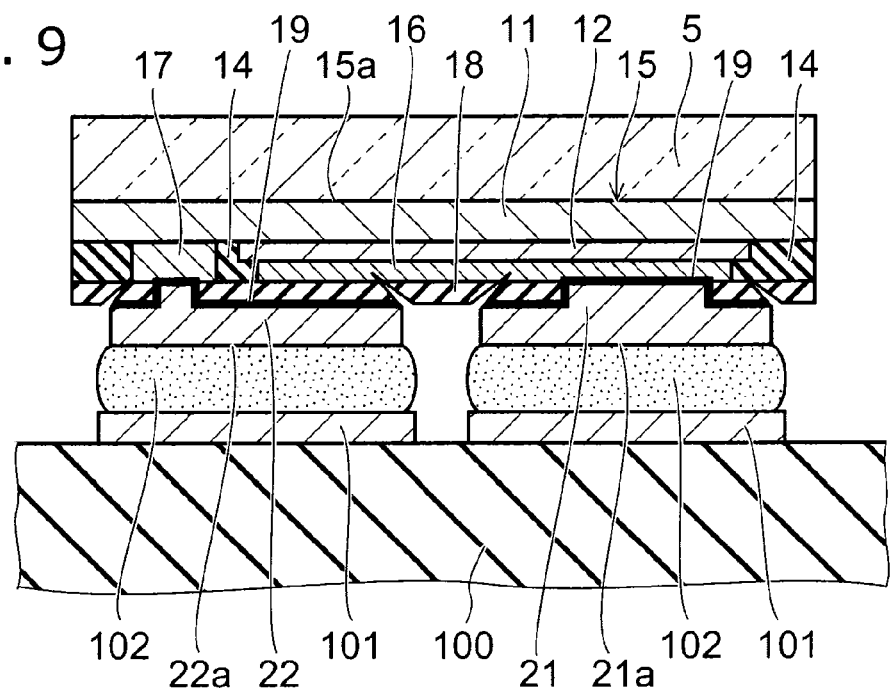
FIG. 9 is a schematic cross-sectional view of a semiconductor light emitting device of a comparative example.

FIG. 9 is a schematic sectional view of a semiconductor light emitting device of a comparative example.

The semiconductor light emitting device of the comparative example does not include the organic insulating film 20 of this embodiment. That is, the first p-side interconnection layer 21 and the first n-side interconnection layer 22 are formed on the inorganic insulating film 18 via the metal film 19. The end portion of the first p-side interconnection layer 21 and the end portion of the first n-side interconnection layer 22 are also formed on the inorganic insulating film 18. Also in this structure, heat of the light emitting layer can be released through the p-side electrode 16 and the inorganic insulating film 18 to the first p-side interconnection layer 21 and the first n-side interconnection layer 22.

The inorganic insulating film 18 has higher thermal conductivity than the organic insulating film. However, the inorganic insulating film 18 tends to be more brittle and fragile. Furthermore, in the state of the semiconductor light emitting device mounted on the mounting substrate 100, a problem arises with the difference in thermal expansion coefficient between the semiconductor layer 15 and the mounting substrate 100. This difference in thermal expansion coefficient generates a stress such that the first p-side interconnection layer 21 and the first n-side interconnection layer 22 constrained to the mounting substrate 100 by the solder 102 and the pads 101 are distanced from each other. By this stress, cracks as shown in FIG. 9 are likely to occur in the inorganic insulating film 18 near the end portion of the first p-side interconnection layer 21 and near the end portion of the first n-side interconnection layer 22. The cracks may cause unintentional short circuit between the components.

In contrast, in this embodiment, the end portion 21b of the first p-side interconnection layer 21 on the first n-side interconnection layer 22 side and the end portion 22b of the first n-side interconnection layer 22 on the first p-side interconnection layer 21 side are provided on the organic insulating film 20 softer than the inorganic insulating film 18. Thus, the organic insulating film 20 relaxes the stress near the end portion 21b and the end portion 22b, where the aforementioned stress is more likely to concentrate. This prevents cracks in the inorganic insulating film 18 and achieves high reliability.

Furthermore, the other end portion of the first p-side interconnection layer 21 different from the aforementioned end portion 21b and the other end portion of the first n-side interconnection layer 22 different from the aforementioned end portion 22b are also provided on the organic insulating film 20. Thus, the organic insulating film 20 relaxes the stress near these end portions and achieves higher reliability.

That is, in this embodiment, high current injection is enabled by using high heat dissipation of the inorganic insulating film 18. Furthermore, the organic insulating film 20 softer than the inorganic insulating film 18 is provided on the portion where the stress is more likely to concentrate. Thus, high reliability is achieved.

Next, a method for manufacturing the semiconductor light emitting device 10 of the embodiment is described with reference to FIGS. 3A to 5C. In the figures showing the manufacturing process, part of a wafer including a plurality of semiconductor layers 15 (chips) is shown.

Figure 3A:
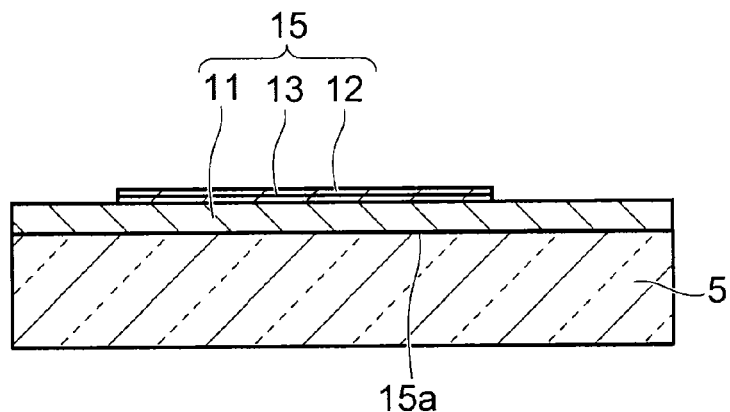
FIGS. 3A to 5C are schematic cross-sectional views illustrating a method for manufacturing the semiconductor light emitting device of the first embodiment.

FIG. 3A shows a stacked body in which a first semiconductor layer 11 and a second semiconductor layer 12 are formed on the major surface of a substrate 5. The first semiconductor layer 11 is formed on the major surface of the substrate 5, and the second semiconductor layer 12 including a light emitting layer 13 is formed on the first semiconductor layer 11. The first semiconductor layer 11 and the second semiconductor layer 12 including e.g. gallium nitride can be crystal grown on e.g. a sapphire substrate by the metal organic chemical vapor deposition (MOCVD) process.

The first semiconductor layer 11 includes an underlying buffer layer and an n-type GaN layer. The second semiconductor layer 12 includes a light emitting layer (active layer) 13 and a p-type GaN layer. The light emitting layer 13 can emit e.g. blue, violet, blue-violet, or ultraviolet light. The surface of the first semiconductor layer 11 in contact with the substrate 5 constitutes a first surface 15a of the semiconductor layer 15.

After forming the semiconductor layer 15 on the substrate 5, part of the second semiconductor layer 12 is removed by e.g. the reactive ion etching (RIE) process using a resist, not shown. Thus, part of the first semiconductor layer 11 is exposed. The region where the first semiconductor layer 11 is exposed does not include the light emitting layer 13.

Figure 3B:
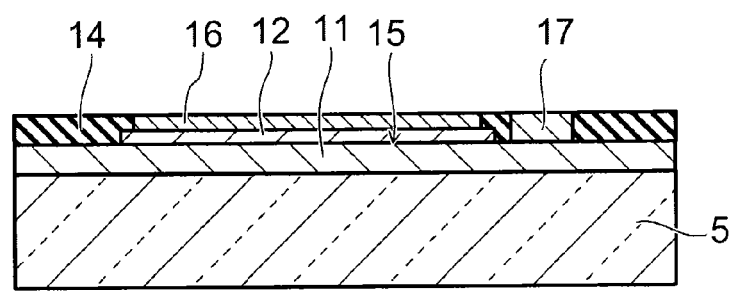

Next, as shown in FIG. 3B, a p-side electrode 16 is formed on the surface of the second semiconductor layer 12, and an n-side electrode 17 is formed on the surface of the first semiconductor layer 11. The p-side electrode 16 and the n-side electrode 17 are formed by e.g. the sputtering or evaporation process. Either the p-side electrode 16 or the n-side electrode 17 may be formed previously, or they may be formed simultaneously from the same material. Activation annealing for forming ohmic contact between each electrode 16, and the semiconductor layer 11, 12 is performed as necessary.

An insulating film 14 is formed on the exposed portion except the surface of the p-side electrode 16 and the surface of the n-side electrode 17. The insulating film 14 is e.g. a silicon oxide film or silicon nitride film. The insulating film 14 is provided between the p-side electrode 16 and the n-side electrode 17 for insulation between these electrodes. Furthermore, the insulating film 14 covers and protects the side surface of the second semiconductor layer 12 including the light emitting layer 13.

Figure 3C:
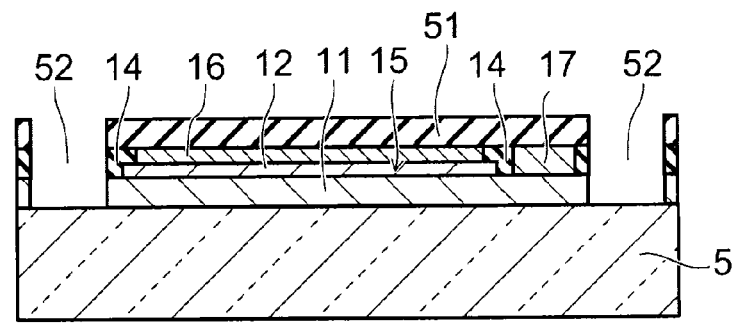

Next, as shown in FIG. 3C, the insulating film 14 and the first semiconductor layer 11 are selectively removed by e.g. the RIE process using a resist 51 as a mask. Thus, a trench 52 reaching the substrate 5 is formed. The trench 52 is formed in e.g. a lattice-like planar layout on the substrate 5 in the wafer state. The trench 52 divides the semiconductor layer 15 into a plurality of chips.

Here, the step of dividing the semiconductor layer 15 into a plurality may be performed in the step shown in FIG. 3A before forming the electrodes 16, 17.

Figure 4A:
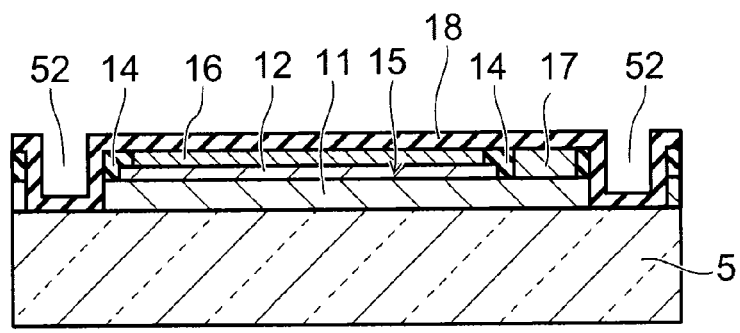

Next, after removing the resist 51, the entire exposed portion on the substrate 5 is covered with an inorganic insulating film 18 as shown in FIG. 4A. That is, the inorganic insulating film 18 is provided on the p-side electrode 16 and on the n-side electrode 17. Furthermore, the inorganic insulating film 18 is provided on the inner wall of the trench 52 and covers the side surface of the first semiconductor layer 11.

Figure 4B:
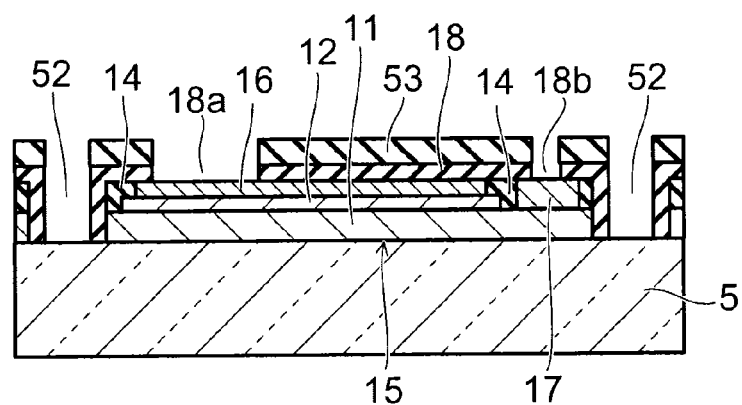

Next, as shown in FIG. 4B, a first via 18a and a second via 18b are formed in the inorganic insulating film 18 by etching using a resist 53 as a mask. The first via 18a reaches the p-side electrode 16. The second via 18b reaches the n-side electrode 17. Furthermore, the inorganic insulating film 18 at the bottom of the trench 52 is removed.

Figure 4C:
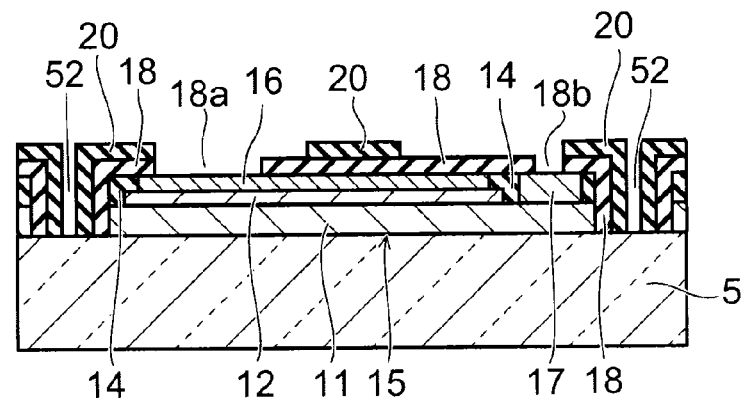

Next, after removing the resist 53, as shown in FIG. 4C, an organic insulating film 20 is selectively formed on the inorganic insulating film 18. The organic insulating film 20 is made of e.g. a photosensitive resin such as polyimide. After forming the organic insulating film 20 on the entire surface of the inorganic insulating film 18, the organic insulating film 20 is patterned by exposure and development using a mask, not shown. The organic insulating film 20 is formed also on the sidewall of the inorganic insulating film 18 in the trench 52.

Figure 5A:
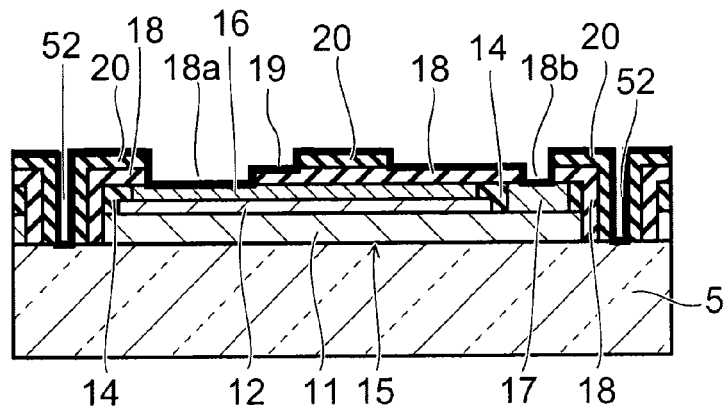

Next, on the exposed portion on the substrate 5, a metal film 19 is formed as shown in FIG. 5A. The metal film 19 is used as a seed metal for the plating described below. The metal film 19 is formed also on the surface of the p-side electrode 16 exposed at the bottom of the first via 18a and the surface of the n-side electrode 17 exposed at the bottom of the second via 18b.

The metal film 19 is formed by e.g. the sputtering process. The metal film 19 includes e.g. a stacked film of titanium (Ti) and copper (Cu) formed sequentially from bottom.

Figure 5B:
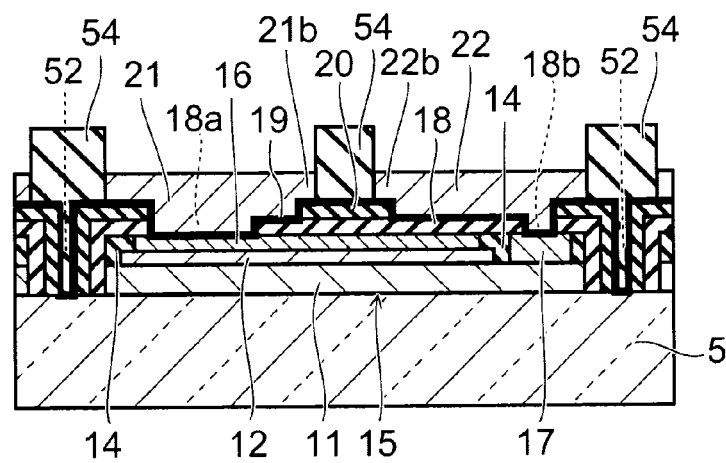
Figure 5C:
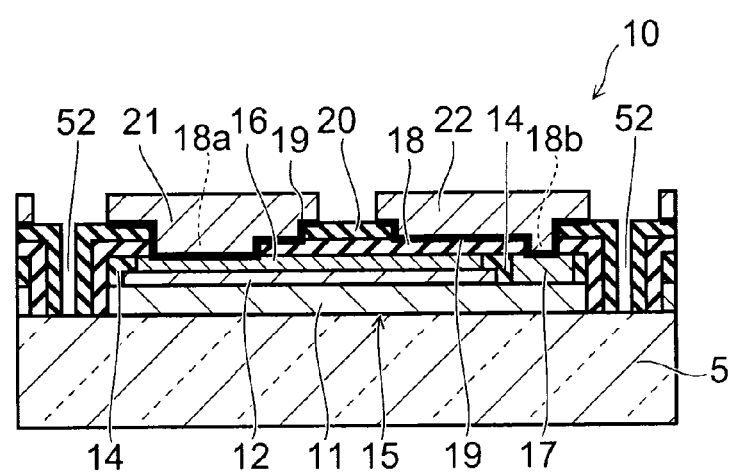

Next, as shown in FIG. 5B, a resist 54 is selectively formed on the metal film 19, and Cu electrolytic plating is performed with the metal film 19 used as a current path. Thus, a first p-side interconnection layer 21 and a first n-side interconnection layer 22 are selectively formed on the metal film 19. The first p-side interconnection layer 21 and the first n-side interconnection layer 22 are made of e.g. a copper material formed simultaneously by the plating process.

The first p-side interconnection layer 21 is formed also in the first via 18a and electrically connected to the p-side electrode 16 through the metal film 19. The first n-side interconnection layer 22 is formed also in the second via 18b and electrically connected to the n-side electrode 17 through the metal film 19.

The organic insulating film 20 is formed on the inorganic insulating film 18 between the first via 18a and the second via 18b. A step is formed between the organic insulating film 20 and the inorganic insulating film 18. The step is covered with the metal film 19 functioning as a seed metal. Thus, the plating metal is deposited so as to cover the aforementioned step.

Hence, the end portion 21b of the first p-side interconnection layer 21 on the first n-side interconnection layer 22 side is provided on the organic insulating film 20. The end portion 22b of the first n-side interconnection layer 22 on the first p-side interconnection layer 21 side is provided on the organic insulating film 20.

After forming the first p-side interconnection layer 21 and the first n-side interconnection layer 22, the resist 54 is removed. Subsequently, the exposed portion of the metal film 19 not covered with the first p-side interconnection layer 21 and the first n-side interconnection layer 22 is removed. Thus, the metal film 19 connected between the first p-side interconnection layer 21 and the first n-side interconnection layer 22 is divided.

Subsequently, the substrate 5 is cut at the position of the trench 52 and singulated into a plurality of semiconductor light emitting devices 10. For instance, the substrate 5 is cut using a dicing blade. Alternatively, the substrate 5 may be cut by laser irradiation. Because the semiconductor layer 15 is not provided in the trench 52, damage to the semiconductor layer 15 at the time of dicing can be avoided.

The singulated semiconductor light emitting device 10 may be of a single-chip structure including one semiconductor layer 15, or may be of a multi-chip structure including a plurality of semiconductor layers 15.

The aforementioned steps until dicing are collectively performed in the wafer state. Hence, there is no need to form interconnection layers and to perform protection with insulating films for each singulated device. This can significantly reduce the production cost. That is, in the singulated state, as shown in FIG. 1A, the side surface of the semiconductor layer 15 has already been covered and protected with the inorganic insulating film 18 and the organic insulating film 20. As a result, the productivity can be improved, and the price reduction is facilitated.

Second Embodiment

Figure 6:
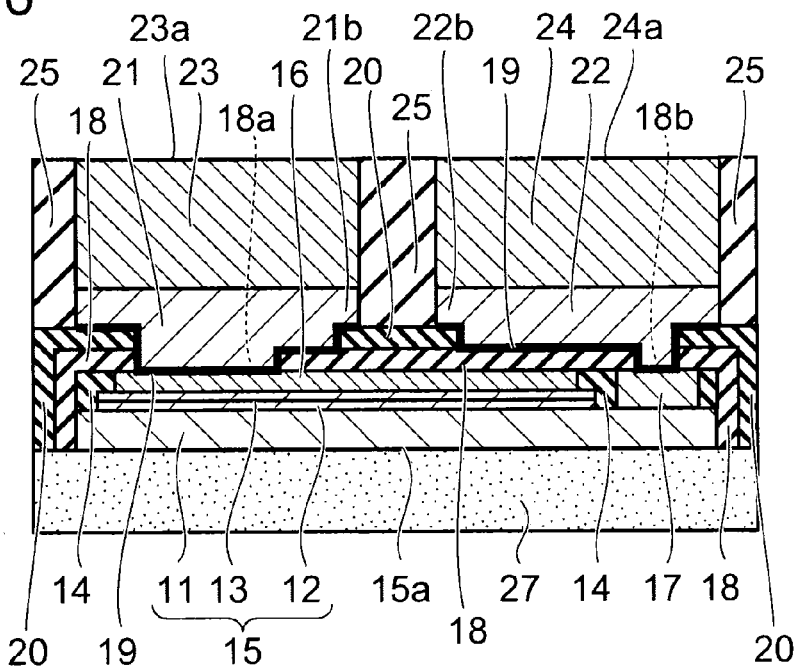
FIG. 6 is a schematic cross-sectional view of a semiconductor light emitting device of a second embodiment.

FIG. 6 is a schematic sectional view of a semiconductor light emitting device of a second embodiment.

In addition to the semiconductor light emitting device of the above first embodiment, the semiconductor light emitting device of this embodiment further includes a second p-side interconnection layer 23, a second n-side interconnection layer 24, and a resin layer 25.

The second p-side interconnection layer 23 is provided on the first p-side interconnection layer 21. In this embodiment, a p-side interconnection portion includes the metal film 19, the first p-side interconnection layer 21, and the second p-side interconnection layer 23.

The second n-side interconnection layer 24 is provided on the first n-side interconnection layer 22. In this embodiment, an n-side interconnection portion includes the metal film 19, the first n-side interconnection layer 22, and the second n-side interconnection layer 24.

The space between the first p-side interconnection layer 21 and the first n-side interconnection layer 22, and the space between the second p-side interconnection layer 23 and the second n-side interconnection layer 24 are filled with the resin layer 25 as an insulating material. The resin layer 25 covers each side surface of the first p-side interconnection layer 21, the first n-side interconnection layer 22, the second p-side interconnection layer 23, and the second n-side interconnection layer 24.

The surface of the second p-side interconnection layer 23 opposite to the first p-side interconnection layer 21 functions as a p-side external terminal 23a. The surface of the second n-side interconnection layer 24 opposite to the first n-side interconnection layer 22 functions as an n-side external terminal 24a.

The p-side external terminal 23a and the n-side external terminal 24a are exposed from the resin layer 25. The p-side external terminal 23a and the n-side external terminal 24a are bonded with solder 102 to the aforementioned pads 101 formed on the mounting substrate 100 shown in FIG. 2.

The second p-side interconnection layer 23 is thicker than the first p-side interconnection layer 21. The second n-side interconnection layer 24 is thicker than the first n-side interconnection layer 22. The thickness of each of the second p-side interconnection layer 23, the second n-side interconnection layer 24, and the resin layer 25 is thicker than that of the semiconductor layer 15. The term "thickness" used herein refers to the vertical thickness in FIG. 6.

The thickness of each of the second p-side interconnection layer 23 and the second n-side interconnection layer 24 is thicker than the thickness of the stacked body including of the semiconductor layer 15, the p-side electrode 16, and the n-side electrode 17. Here, the aspect ratio (ratio of thickness to planar size) of the second p-side interconnection layer 23 and the second n-side interconnection layer 24 is not limited to being one or more, but the ratio may be less than one. That is, the thickness of the second p-side interconnection layer 23 and the second n-side interconnection layer 24 may be smaller than the planar size thereof.

The second p-side interconnection layer 23, the second n-side interconnection layer 24, and the resin layer 25 for reinforcing them function as a support body for the semiconductor layer 15. Hence, even if the substrate 5 used for forming the semiconductor layer 15 is removed as described below, the support body including the second p-side interconnection layer 23, the second n-side interconnection layer 24, and the resin layer 25 can stably support the semiconductor layer 15 and increase the mechanical strength of the semiconductor light emitting device.

Furthermore, the second p-side interconnection layer 23 and the second n-side interconnection layer 24 shaped like pillars can absorb and relax the stress applied to the semiconductor layer 15 in the state of the semiconductor light emitting device mounted on a mounting substrate.

The material of the first p-side interconnection layer 21, the first n-side interconnection layer 22, the second p-side interconnection layer 23, and the second n-side interconnection layer 24 can be copper, gold, nickel, or silver. Among them, copper can provide good thermal conductivity, high migration resistance, and superior adhesion to insulating materials.

The thermal expansion coefficient of the resin layer 25 may be equal or close to that of the mounting substrate 100. Such a resin layer 25 can be made of e.g. epoxy resin, silicone resin, or fluororesin.

Furthermore, for instance, carbon black may be contained in the resin layer 25 so that the resin layer 25 can shield the emission light from the light emitting layer 13. Furthermore, powder capable of reflecting the emission light from the light emitting layer 13 may be contained in the resin layer 25.

Also in this embodiment, the end portion of the first p-side interconnection layer 21 and the end portion of the first n-side interconnection layer 22 are provided on the organic insulating film 20 softer than the inorganic insulating film 18. Thus, the organic insulating film 20 can relax the aforementioned stress and prevent cracks in the inorganic insulating film 18.

That is, also in this embodiment, high current injection is enabled by using high heat dissipation of the inorganic insulating film 18. Simultaneously, the organic insulating film 20 softer than the inorganic insulating film 18 is provided on the portion where the stress is likely to concentrate. Thus, high reliability is achieved.

On the first surface 15a of the semiconductor layer 15, a phosphor layer 27 is provided as a transparent body being transparent to the emission light of the light emitting layer 13. The phosphor layer 27 includes a transparent resin and phosphor particles dispersed in the transparent resin. The phosphor layer 27 can absorb the emission light from the light emitting layer 13 and emit wavelength converted light. Thus, the semiconductor light emitting device of this embodiment can emit mixed light of the light from the light emitting layer 13 and the wavelength converted light of the phosphor layer 27.

The transparent resin in the phosphor layer 27 has a refractive index between the refractive index of the semiconductor layer 15 and the refractive index of air. This prevents the refractive index of the medium from changing greatly in the direction of light extraction through the first surface 15a and the phosphor layer 27. Thus, the light extraction efficiency can be increased.

For instance, the phosphor particles can be yellow phosphor particles emitting yellow light. Then, the blue light from the light emitting layer 13 made of GaN-based materials and the yellow light of the wavelength converted light of the phosphor layer 27 can be mixed to obtain white or light bulb color as a mixed color. Here, the phosphor layer 27 may be configured to include a plurality of kinds of phosphor particles (e.g., red phosphor particles emitting red light and green phosphor particles emitting green light).

The phosphor layer 27 is formed on the first surface 15a after the substrate 5 used for growing the semiconductor layer 15 is removed from the semiconductor layer 15. By removing the substrate 5 from above the first surface 15a, the profile of the semiconductor light emitting device can be made lower.

After forming the support body including the second p-side interconnection layer 23, the second n-side interconnection layer 24, and the resin layer 25, the substrate 5 is removed by e.g. the laser lift-off process in the state of the semiconductor layer 15 supported by the support body.

Laser light is applied from the rear surface side of the substrate 5 toward the first semiconductor layer 11. The laser light can be transmitted through the substrate 5 and has a wavelength in the absorption region for the first semiconductor layer 11.

When the laser light reaches the interface between the substrate 5 and the first semiconductor layer 11, the first semiconductor layer 11 near the interface is decomposed by absorbing the energy of the laser light. For instance, the first semiconductor layer 11 made of GaN-based materials is decomposed into gallium (Ga) and nitrogen gas. By this decomposition reaction, a fine gap is formed between the substrate 5 and the first semiconductor layer 11. Thus, the substrate 5 and the first semiconductor layer 11 are separated. Irradiation with the laser light is performed a plurality of times for each specified region throughout the wafer to remove the substrate 5.

The semiconductor layer 15 is supported by the support body thicker than the semiconductor layer 15. Hence, even if the substrate 5 is eliminated, the wafer state can be maintained. Furthermore, both the resin layer 25 and the metal constituting the second p-side interconnection layer 23 and the second n-side interconnection layer 24 are made of softer materials than the semiconductor layer 15. Hence, device destruction can be avoided even if the large internal stress generated in the epitaxial growth for forming the semiconductor layer 15 on the substrate 5 is released at once in removing the substrate 5.

After removing the substrate 5, the first surface 15a is cleaned and, as necessary, subjected to frost treatment for forming protrusions and depressions. By forming fine protrusions and depressions at the first surface 15a, the light extraction efficiency can be increased. Subsequently, the phosphor layer 27 is formed on the first surface 15a. Furthermore, as necessary, a lens is formed on the first surface 15a or on the phosphor layer 27.

The step of forming the phosphor layer 27 includes the step of supplying a liquid transparent resin dispersed with phosphor particles onto the first surface 15a by a method such as printing, potting, molding, and compression molding, and the step of heat curing it.

The sequence of steps until forming the phosphor layer 27 is performed in the wafer state. After forming the phosphor layer 27, the wafer is cut from the resin layer 25 to the phosphor layer 27 at the position of the aforementioned trench 52 and singulated. At this time, the hard substrate 5 has already been removed. Hence, there is no need to cut the substrate 5. This facilitates singulation.

Third Embodiment

Figure 7:
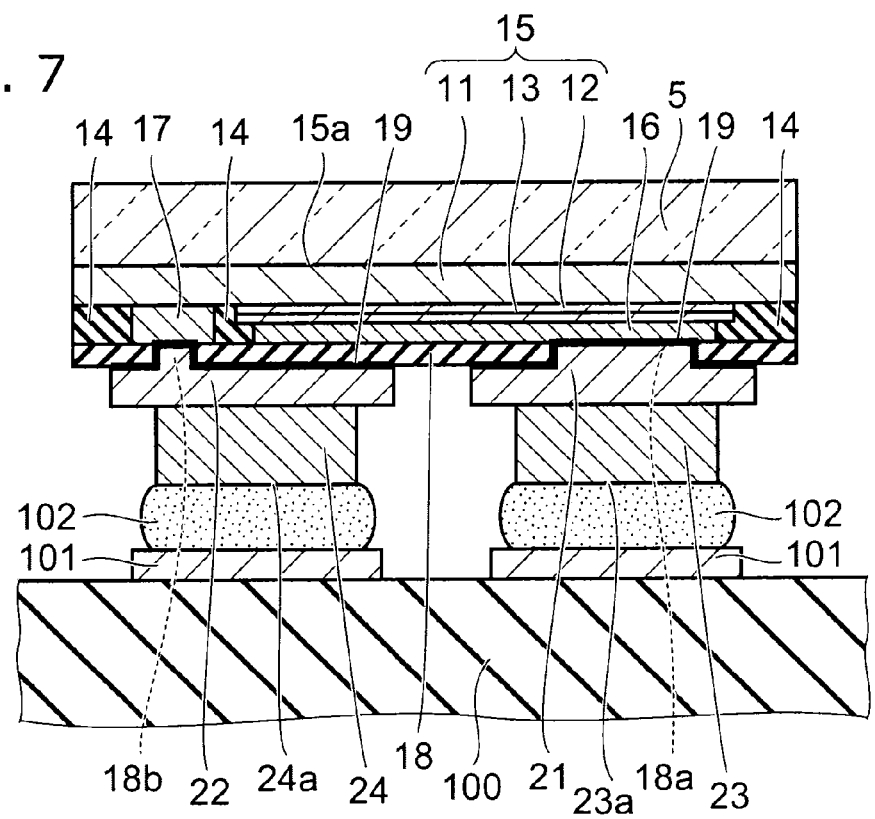
FIG. 7 is a schematic cross-sectional view of a semiconductor light emitting device of a third embodiment.

FIG. 7 is a schematic sectional view of a semiconductor light emitting device of a third embodiment.

The first p-side interconnection layer 21 and the first n-side interconnection layer 22 in this embodiment are provided on the inorganic insulating film 18. The end portion of the first p-side interconnection layer 21 and the end portion of the first n-side interconnection layer 22 are also formed on the inorganic insulating film 18. The organic insulating film 20 of the above embodiments is not interposed between the end portion of the first p-side interconnection layer 21 and the inorganic insulating film 18, and between the end portion of the first n-side interconnection layer 22 and the inorganic insulating film 18.

A second p-side interconnection layer 23 is provided on the surface of the first p-side interconnection layer 21 opposite from the inorganic insulating film 18. In this embodiment, a p-side interconnection portion includes the metal film 19, the first p-side interconnection layer 21, and the second p-side interconnection layer 23.

A second n-side interconnection layer 24 is provided on the surface of the first n-side interconnection layer 22 opposite from the inorganic insulating film 18. In this embodiment, an n-side interconnection portion includes the metal film 19, the first n-side interconnection layer 22, and the second n-side interconnection layer 24.

The planar size of the second p-side interconnection layer is smaller than the planar size of the first p-side interconnection layer 21. A step is formed between the side surface of the first p-side interconnection layer 21 and the side surface of the second p-side interconnection layer 23.

Likewise, the planar size of the second n-side interconnection layer 24 is smaller than the planar size of the first n-side interconnection layer 22. A step is formed between the side surface of the first n-side interconnection layer 22 and the side surface of the second n-side interconnection layer 24.

The space between the first p-side interconnection layer 21 and the first n-side interconnection layer 22 is not filled with an insulating material such as resin. The first p-side interconnection layer 21 and the first n-side interconnection layer 22 are spaced by a gap from each other. The space between the second p-side interconnection layer 23 and the second n-side interconnection layer 24 is also not filled with an insulating material such as resin. The second p-side interconnection layer 23 and the second n-side interconnection layer 24 are spaced by a gap from each other.

The surface of the second p-side interconnection layer 23 opposite to the first p-side interconnection layer 21 functions as a p-side external terminal 23a. The surface of the second n-side interconnection layer 24 opposite to the first n-side interconnection layer 22 functions as an n-side external terminal 24a. The p-side external terminal 23a and the n-side external terminal 24a exposed at the same surface are bonded with solder 102 to the pads 101 formed on the mounting substrate 100.

The second p-side interconnection layer 23 is thicker than the first p-side interconnection layer 21. The second n-side interconnection layer 24 is thicker than the first n-side interconnection layer 22. The thickness of each of the second p-side interconnection layer 23, the second n-side interconnection layer 24, and the resin layer 25 is thicker than that of the semiconductor layer 15.

The distance between the p-side external terminal 23a and the n-side external terminal 24a is larger than the distance between the first p-side interconnection layer 21 and the first n-side interconnection layer 22 on the inorganic insulating film 18. That is, the p-side external terminal 23a and the n-side external terminal 24a are separated by such a distance as to prevent short circuit between the p-side external terminal 23a and the n-side external terminal 24a with solder 102 when mounted onto the mounting substrate 100.

The first p-side interconnection layer 21 not functioning as an external terminal can be made close to the first n-side interconnection layer 22 up to the process limit. Thus, the area of the first p-side interconnection layer 21 can be enlarged. As a result, the distribution of current to the light emitting layer 13 and the heat dissipation can be improved.

The planar size of the second p-side interconnection layer 23 is made smaller than the planar size of the first p-side interconnection layer 21. Thus, a step is formed from the side surface of the first p-side interconnection layer 21 to the side surface of the second p-side interconnection layer 23. That is, the p-side interconnection portion including the first p-side interconnection layer 21 and the second p-side interconnection layer 23 is slimmer on the mounting substrate 100 side.

Likewise, the planar size of the second n-side interconnection layer 24 is made smaller than the planar size of the first n-side interconnection layer 22. Thus, a step is formed from the side surface of the first n-side interconnection layer 22 to the side surface of the second n-side interconnection layer 24. That is, the n-side interconnection portion including the first n-side interconnection layer 22 and the second n-side interconnection layer 24 is slimmer on the mounting substrate 100 side.

Thus, the second p-side interconnection layer 23 and the second n-side interconnection layer 24 being slimmer absorb and relax the stress applied to the semiconductor light emitting device side in the state of the semiconductor light emitting device mounted on the mounting substrate. This can suppress stress concentration on the end portion of the first p-side interconnection layer 21 and the end portion of the first n-side interconnection layer 22, and prevent cracks in the inorganic insulating film 18 near the end portions.

Figure 8:
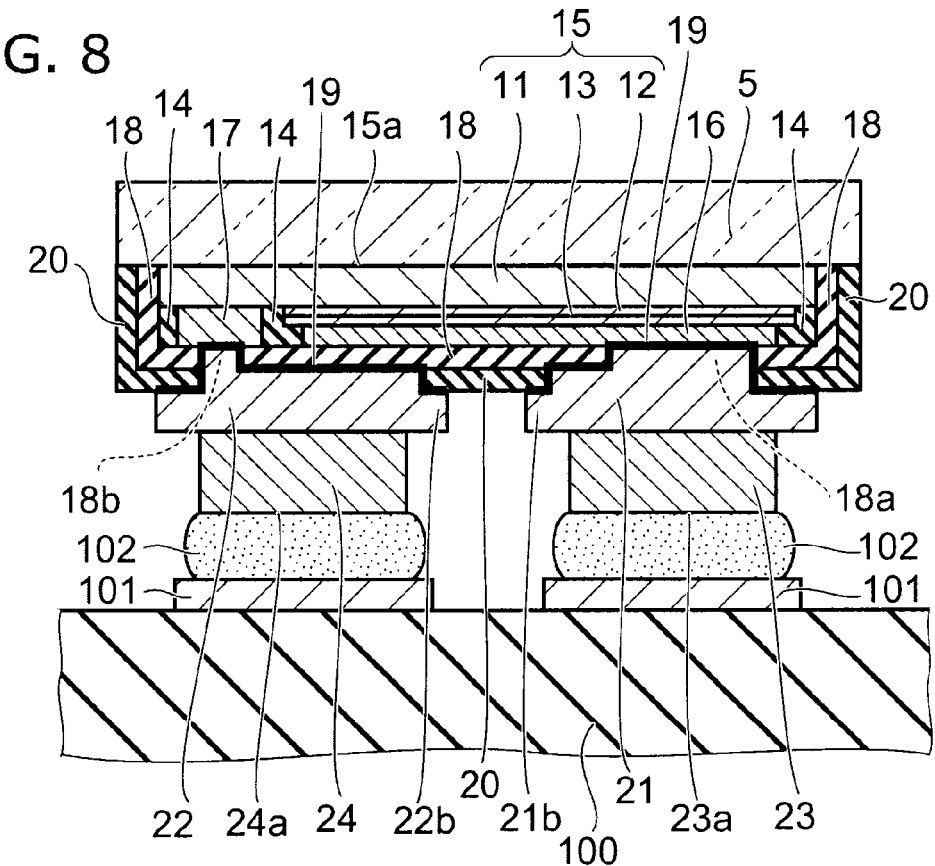
FIG. 8 is a schematic cross-sectional view of a semiconductor light emitting device of a fourth embodiment.

Hence, also in this embodiment, high current injection is enabled by using high heat dissipation of the inorganic insulating film 18. Simultaneously, cracks in the inorganic insulating film 18 are prevented to achieve high reliability. Fourth embodiment FIG. 8 is a schematic sectional view of a semiconductor light emitting device of a fourth embodiment.

In this embodiment, as in the first embodiment, the end portion of the first p-side interconnection layer 21 and the end portion of the first n-side interconnection layer 22 are provided on the organic insulating film 20 softer than the inorganic insulating film 18. Thus, the organic insulating film 20 can relax the aforementioned stress and prevent cracks in the inorganic insulating film 18.

Furthermore, as in the third embodiment, the planar size of the second p-side interconnection layer 23 is made smaller than the planar size of the first p-side interconnection layer 21.

Thus, a step is formed from the side surface of the first p-side interconnection layer 21 to the side surface of the second p-side interconnection layer 23. That is, the p-side interconnection portion including the first p-side interconnection layer 21 and the second p-side interconnection layer 23 is slimmer on the mounting substrate 100 side.

Likewise, the planar size of the second n-side interconnection layer 24 is made smaller than the planar size of the first n-side interconnection layer 22. Thus, a step is formed from the side surface of the first n-side interconnection layer 22 to the side surface of the second n-side interconnection layer 24. That is, the n-side interconnection portion including the first n-side interconnection layer 22 and the second n-side interconnection layer 24 is slimmer on the mounting substrate 100 side.

Thus, the second p-side interconnection layer 23 and the second n-side interconnection layer 24 absorb and relax the stress applied to the semiconductor light emitting device side in the state of the semiconductor light emitting device mounted on the mounting substrate.

That is, also in this embodiment, high current injection is enabled by using high heat dissipation of the inorganic insulating film 18. Simultaneously, local stress concentration on the inorganic insulating film 18 is prevented to achieve high reliability.

In the structures shown in FIGS. 7 and 8, the periphery of the first p-side interconnection layer 21, the first n-side interconnection layer 22, the second p-side interconnection layer 23, and the second n-side interconnection layer 24 may be filled with a resin layer 25 as in the structure shown in FIG. 6. By thickening the second p-side interconnection layer 23, the second n-side interconnection layer 24, and the resin layer 25, the thin semiconductor layer 15 can be stably supported without the substrate 5.

In the structures shown in FIGS. 2, 7, and 8, a phosphor layer 27 may be provided on the substrate 5.

The aforementioned phosphor layer can be a red phosphor layer, yellow phosphor layer, green phosphor layer, or blue phosphor layer illustrated below.

The red phosphor layer can contain e.g. nitride phosphor $CaAlSiN_3$:Eu or SiAlON phosphor.

In the case of using SiAlON phosphor, the phosphor represented by the composition formula $$(M_{1-x}R_x)_{a1}AlSi_{b1}O_{c1}N_{d1} \qquad (1)$$

(M is at least one metallic element except Si and Al, and notably at least one of Ca and Sr. R is an emission center element, and notably Eu. The quantities x, a1, b1, c1, and d1 satisfy the following relations: x is larger than 0 and 1 or less, a1 is larger than 0.6 and less than 0.95, b1 is larger than 2 and less than 3.9, c1 is larger than 0.25 and less than 0.45, and d1 is larger than 4 and less than 5.7) can be used.

By using the SiAlON phosphor represented by the composition formula (1), the temperature characteristics of wavelength conversion efficiency are improved. Thus, the efficacy in the high current density region can be further increased.

The yellow phosphor layer can contain e.g. silicate phosphor $(Sr,Ca,Ba)_2SiO_4$:Eu.

The green phosphor layer can contain e.g. halophosphate phosphor $(Ba,Ca,Mg)_{10}(PO_4)_6Cl_2$:Eu or SiAlON phosphor. In the case of using SiAlON phosphor, the phosphor represented by the composition formula $$(M_{1-x}R_x)_{a2}AlSi_{b2}O_{c2}N_{d2} \qquad (2)$$

(M is at least one metallic element except Si and Al, and notably at least one of Ca and Sr. R is an emission center element, and notably Eu. The quantities x, a2, b2, c2, and d2 satisfy the following relations: x is larger than 0 and 1 or less, a2 is larger than 0.93 and less than 1.3, b2 is larger than 4.0 and less than 5.8, c2 is larger than 0.6 and less than 1, and d2 is larger than 6 and less than 11) can be used.

By using the SiAlON phosphor represented by the composition formula (2), the temperature characteristics of wavelength conversion efficiency are improved. Thus, the efficacy in the high current density region can be further increased.

The blue phosphor layer can contain e.g. oxide phosphor $BaMgAl_{10}O_{17}$:Eu.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a semiconductor layer including a first surface, a second surface opposite to the first surface, and a light emitting layer provided between the first surface and the second surface;
a p-side electrode provided on the semiconductor layer;
an n-side electrode provided on the semiconductor layer;
an inorganic insulating film provided on the second surface side and including a first via penetrated to the p-side electrode and a second via penetrated to the n-side electrode;
a p-side interconnection portion provided on the inorganic insulating film and electrically connected to the p-side electrode through the first via;
an n-side interconnection portion provided on the inorganic insulating film, spaced from the p-side interconnection portion, and electrically connected to the n-side electrode through the second via; and
an organic insulating film provided on the inorganic insulating film, at least on a portion between the p-side interconnection portion and the n-side interconnection portion,
an end portion of the p-side interconnection portion on the n-side interconnection portion side and an end portion of the n-side interconnection portion on the p-side interconnection portion side overriding the organic insulating film, and
the organic insulating film being interposed between the end portion of the p-side interconnection portion and the inorganic insulating film, and between the end portion of the n-side interconnection portion and the inorganic insulating film.

2. The device of claim 1, wherein
a step is formed between the inorganic insulating film and the organic insulating film, and
the p-side interconnection portion and the n-side interconnection portion cover the step.

3. The device of claim 1, wherein the organic insulating film is provided also between another end portion of the p-side interconnection portion different from the end portion on the n-side interconnection portion side and the inorganic insulating film, and between another end portion of the n-side interconnection portion different from the end portion on the p-side interconnection portion side and the inorganic insulating film.

4. The device of claim 1, wherein part of the n-side interconnection portion overlaps the inorganic insulating film on the region including the light emitting layer.

5. The device of claim 1, wherein area of the n-side interconnection portion spread on the inorganic insulating film is larger than area of the n-side interconnection portion connected to the n-side electrode through the second via.

6. The device of claim 1, wherein
the p-side interconnection portion includes a p-side external terminal exposed from the inorganic insulating film and the organic insulating film, and
the n-side interconnection portion includes an n-side external terminal exposed from the inorganic insulating film and the organic insulating film at a same surface as the p-side external terminal.

7. The device of claim 1, wherein
the p-side interconnection portion includes a first p-side interconnection layer provided on the inorganic insulating film and the organic insulating film, and a second p-side interconnection layer provided on the first p-side interconnection layer, and
the n-side interconnection portion includes a first n-side interconnection layer provided on the inorganic insulating film and the organic insulating film, and a second n-side interconnection layer provided on the first n-side interconnection layer.

8. The device of claim 7, wherein the second p-side interconnection layer is thicker than the first p-side interconnection layer, and the second n-side interconnection layer is thicker than the first n-side interconnection layer.

9. The device of claim 7, further comprising:
an insulating material filling in between the first p-side interconnection layer and the first n-side interconnection layer, and between the second p-side interconnection layer and the second n-side interconnection layer.

10. The device of claim 7, wherein
the second p-side interconnection layer includes a p-side external terminal exposed from the inorganic insulating film, the organic insulating film, and the insulating material, and
the second n-side interconnection layer includes an n-side external terminal exposed from the inorganic insulating film, the organic insulating film, and the insulating material at a same surface as the p-side external terminal.

11. The device of claim 1, further comprising:
a transparent body provided on the first surface and being transparent to emission light of the light emitting layer.

12. The device of claim 11, wherein the transparent body is a substrate thicker than the semiconductor layer.

13. The device of claim 12, wherein the substrate has a refractive index between refractive index of the semiconductor layer and refractive index of air.

14. The device of claim 11, wherein the transparent body is a phosphor layer.

15. The device of claim 14, wherein the phosphor layer includes a transparent resin having a refractive index between refractive index of the semiconductor layer and refractive index of air, and phosphor particles dispersed in the transparent resin.

16. A semiconductor light emitting device comprising:
a semiconductor layer including a first surface, a second surface opposite to the first surface, and a light emitting layer provided between the first surface and the second surface;
a p-side electrode provided on the semiconductor layer;
an n-side electrode provided on the semiconductor layer;
an insulating film provided on the second surface side and including a first via penetrated to the p-side electrode and a second via penetrated to the n-side electrode;
a first p-side interconnection layer provided on the insulating film and electrically connected to the p-side electrode through the first via;
a first n-side interconnection layer provided on the insulating film, spaced from the first p-side interconnection layer, and electrically connected to the n-side electrode through the second via;
a second p-side interconnection layer provided on the first p-side interconnection layer and having a smaller planar size than the first p-side interconnection layer; and
a second n-side interconnection layer provided on the first n-side interconnection layer and having a smaller planar size than the first n-side interconnection layer,
the first p-side interconnection layer and the first n-side interconnection layer being spaced by a gap from each other, and the second p-side interconnection layer and the second n-side interconnection layer being spaced by a gap from each other, and a step being formed between the first p-side interconnection layer and the second p-side interconnection layer, and between the first n-side interconnection layer and the second n-side interconnection layer, wherein the gap between the first p-side interconnection layer and the first n-side interconnection layer is not filled with an insulating material, and the gap between the second p-side interconnection layer and the second n-side interconnection layer is not filled with an insulating material.

17. The device of claim 16, wherein the insulating film is an inorganic insulating film, the device further includes an organic insulating film provided on the inorganic insulating film, at least on a portion between the first p-side interconnection layer and the first n-side interconnection layer, and an end portion of the first p-side interconnection layer on the first n-side interconnection layer side and an end portion of the first n-side interconnection layer on the first p-side interconnection layer side override the organic insulating film.

18. The device of claim 17, wherein part of the first n-side interconnection layer overlaps the inorganic insulating film on the region including the light emitting layer.

19. The device of claim 16, wherein area of the first n-side interconnection layer spread on the insulating film is larger than area of the first n-side interconnection layer connected to the n-side electrode through the second via.

20. The device of claim 16, wherein the second p-side interconnection layer is thicker than the first p-side interconnection layer, and the second n-side interconnection layer is thicker than the first n-side interconnection layer.

21. A semiconductor light emitting device comprising: a semiconductor layer including a first surface, a second surface opposite to the first surface, and a light emitting layer provided between the first surface and the second surface; a p-side electrode provided on the semiconductor layer; an n-side electrode provided on the semiconductor layer; an insulating film provided on the second surface side and including a first via penetrated to the p-side electrode and a second via penetrated to the n-side electrode; a first p-side interconnection layer provided on the insulating film and electrically connected to the p-side electrode through the first via; a first n-side interconnection layer provided on the insulating film, spaced from the first p-side interconnection layer, and electrically connected to the n-side electrode through the second via; a second p-side interconnection layer provided on the first p-side interconnection layer and having a smaller planar size than the first p-side interconnection layer; and a second n-side interconnection layer provided on the first n-side interconnection layer and having a smaller planar size than the first n-side interconnection layer, the first p-side interconnection layer and the first n-side interconnection layer being spaced by a gap from each other, and the second p-side interconnection layer and the second n-side interconnection layer being spaced by a gap from each other, and a step being formed between the first p-side interconnection layer and the second p-side interconnection layer, and between the first n-side interconnection layer and the second n-side interconnection layer, wherein the gap between the first p-side interconnection layer and the first n-side interconnection layer is an air gap, and the gap between the second p-side interconnection layer and the second n-side interconnection layer is an air gap.

* * * * *